United States Patent
Hahn et al.

(10) Patent No.: US 8,053,761 B2
(45) Date of Patent: Nov. 8, 2011

(54) METHODS OF FABRICATING ORGANIC THIN FILM TRANSISTORS AND ORGANIC THIN FILM TRANSISTORS FABRICATED USING THE SAME

(75) Inventors: Jung Seok Hahn, Senongnam-si (KR); Bon Won Koo, Suwon-si (KR); Joo Young Kim, Suwon-si (KR); Kook Min Han, Suwon-si (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1380 days.

(21) Appl. No.: 11/604,826

(22) Filed: Nov. 28, 2006

(65) Prior Publication Data

US 2007/0194386 A1 Aug. 23, 2007

(30) Foreign Application Priority Data

Feb. 17, 2006 (KR) ........................ 10-2006-0015582

(51) Int. Cl.
*H01L 51/10* (2006.01)
*H01L 51/30* (2006.01)
*H01L 51/40* (2006.01)

(52) U.S. Cl. ........... 257/40; 257/E51.006; 257/E51.025; 257/E51.027; 257/E51.052; 438/99

(58) Field of Classification Search .................... 257/40, 257/E51.006, E51.007, E51.025, E51.052; 438/99

See application file for complete search history.

(56) References Cited

U.S. PATENT DOCUMENTS

| | | | |
|---|---|---|---|
| 7,719,496 B2 * | 5/2010 | Ahn et al. ........................ | 345/82 |
| 7,816,671 B2 * | 10/2010 | Park et al. ........................ | 257/40 |
| 2004/0161873 A1 | 8/2004 | Dimitrakopoulos et al. | |
| 2006/0289858 A1 * | 12/2006 | Park et al. ........................ | 257/40 |
| 2008/0105866 A1 * | 5/2008 | Jeong et al. ........................ | 257/40 |
| 2010/0065830 A1 * | 3/2010 | Kim et al. ........................ | 257/40 |

FOREIGN PATENT DOCUMENTS

KR 10-2005-0056196 6/2005

OTHER PUBLICATIONS

L.A. Majewski et al., "Organic Field-Effect Transistors With Ultrathin Gate Insulator" Synthetic Metals 144 (2004), p. 97-100.

* cited by examiner

*Primary Examiner* — Anh Phung
*Assistant Examiner* — Michael Lulis
(74) *Attorney, Agent, or Firm* — Harness, Dickey & Pierce, PLC

(57) ABSTRACT

Disclosed are methods of fabricating organic thin film transistors composed of a substrate, a gate electrode, a gate insulating film, metal oxide source/drain electrodes, and an organic semiconductor layer. The methods include applying a sufficient quantity of a self-assembled monolayer compound containing a live ion to the surfaces of the metal oxide electrodes to form a self-assembled monolayer. The presence of the live ion at the interface between the metal oxide electrodes and the organic semiconductor layer modifies the relative work function of these materials. Further, the presence of the self-assembled monolayer on the gate insulating film tends to reduce hysteresis. Accordingly, organic thin film transistors fabricated in accord with the example embodiments tend to exhibit improved charge mobility, improved gate insulating film properties and decreased hysteresis associated with the organic insulator.

19 Claims, 1 Drawing Sheet

METHODS OF FABRICATING ORGANIC THIN FILM TRANSISTORS AND ORGANIC THIN FILM TRANSISTORS FABRICATED USING THE SAME

PRIORITY STATEMENT

This non-provisional application claims priority under 35 U.S.C. §119(a) from Korean Patent Application No. 2006-15582, which was filed on Feb. 17, 2006, which is herein incorporated, in its entirety, by reference.

BACKGROUND

1. Field of Endeavor

Example embodiments generally relate to methods of fabricating organic thin film transistors, and more particularly, to methods of fabricating organic thin film transistors comprising a substrate, a gate electrode, a gate insulating film, metal oxide source/drain electrodes, and an organic semiconductor layer, in which the surfaces of the metal oxide source/drain electrodes are treated with a self-assembled monolayer (SAM) compound containing a live ion.

2. Description of Related Art

After the development of polyacetylene, a conjugated organic polymer having semiconductor properties, organic semiconductors have received attention as electronic materials as a result of certain of the advantages associated with organic semiconductor material over conventional inorganic materials. These advantages include, for example, a variety of synthesis methods, easy formability into fibers or films, flexibility, conductivity, and relatively low preparation costs. Organic semiconductor materials have, therefore, been of interest and a subject of study in the field of functional electronic devices and optical devices.

With respect to electronic devices incorporating one or more conductive polymers, research into organic thin film transistors including an active layer formed of organic material began in about 1980, with research still ongoing throughout the world. Organic thin film transistor have a structure generally corresponding to conventional inorganic semiconductors, for example silicon (Si) thin film transistors but in which at least one of the conventional semiconductor regions have been replaced with a suitable organic material.

Compared to conventional silicon thin film transistors, organic thin film transistors can simplify the fabrication process by permitting a semiconductor layer to be formed using a printing process at atmospheric pressure, thereby avoiding the need for chemical vapor deposition (CVD) processes using plasma. Indeed, the process of fabricating an organic semiconductor pattern may be carried out using a roll-to-roll process on a plastic substrate, if desired, which may, in turn, decrease the overall cost and/or time required for fabricating the transistor. Accordingly, organic thin film transistors are expected to be utilized in a variety of applications including, for example, driving devices for use with active displays, smart cards, plastic chips for inventory tags, for example, radio frequency identification chips (RFID).

As known to those skilled in the art, however, organic thin film transistors are also associated with certain drawbacks including, for example, lower charge mobilities, higher operating voltages and/or higher threshold voltages, when compared with conventional silicon thin film transistors. It has been reported that the charge mobility within the organic semiconductor may be increased to a level of 0.6 $cm^2 \cdot V^{-1} \cdot sec^{-1}$ using pentacene, thus considerably increasing the probability of actually realizing an organic thin film transistor. However, even the improvements reflected in these reports, the charge mobility is still generally considered unsatisfactory. Indeed, in some instances operating voltages in excess of 100 V or more and threshold voltages on the order of at least 50 times the typical threshold voltage for a corresponding silicon thin film transistor are required for device operation.

In those instances in which the organic thin film transistor is configured as a bottom contact type or top gate type organic thin film transistor, the organic semiconductor material(s), for example, pentacene, tends to grow relatively less on the source/drain electrodes when compared with corresponding growth on the gate insulating film and, as a result, tends to exhibit a work function higher than that of the metal(s) forming the source/drain electrodes. Accordingly, an undesirable Schottky barrier tends to be formed between the source/drain electrodes and the organic semiconductor layer, thereby tending to decrease the charge mobility of the organic thin film transistor.

In this regard, a method of fabricating an organic thin film transistor has been disclosed in which the exposed surfaces of source/drain electrodes are treated with an SAM compound containing a thiol functional group before depositing an organic semiconductor layer, thereby attempting to increase the electric performance of the organic thin film transistor, in particular, its charge mobility. However, because the compound mentioned above binds only to the surface of metal, for example, gold (Au), but does not bind to metal oxide, for example, ITO (Indium Tin Oxide), the organic thin film transistor including the source/drain electrodes made of metal oxide and the organic semiconductor layer cannot generally not reach a desired degree or magnitude of charge mobility.

In addition, another method of fabricating an organic thin film transistor comprises treating the surface of metal oxide source/drain electrodes with an SAM compound containing a sulfonic acid group, thereby changing the hydrophobic properties of the source/drain electrodes and increasing the charge mobility. In this case, the SAM compound acts to reduce or eliminate the formation of Schottky barriers between the source/drain electrodes and the organic semiconductor layers. The SAM compound also tends to decrease contact resistance as a result of physical adsorption or chemical bonding to metal oxide, thereby tending to increase charge mobility. However, in the organic insulator formed through a surface crosslinking process, metal ions, for example, a hydrogen ion ($H^+$), are mainly generated as by-products of the crosslinking polymerization resulting from the properties of organic insulator material itself, thereby undesirably causing increased hysteresis, a condition that negatively affects the reliability with regard to the actual operation of the device.

SUMMARY OF EXAMPLE EMBODIMENTS

Accordingly, example embodiments provide methods of fabricating organic thin film transistors, in which the surface of metal oxide source/drain electrodes is treated with a live ion-containing SAM compound and thereby increase a work function of a metal oxide relative to that of an organic semiconductor material. Example embodiments of the organic thin film transistors fabricated using such methods tend to exhibit increased charge mobility associated the live ions provided between an insulating film and a semiconductor film. Example embodiments of the organic thin film transistors fabricated using such methods tend to exhibit improved control of the ion supply as a function of an applied electric charge, thereby tending to decrease hysteresis effects and may be incorporated in various applications including, for example, display devices.

Example embodiments provide methods of fabricating organic thin film transistors comprising a substrate, a gate electrode, a gate insulating film, metal oxide source/drain electrodes, and an organic semiconductor layer, wherein the surface of the metal oxide source/drain electrodes are treated with a live ion-containing SAM compound.

As used herein, the term "live ion" may refer to terminal functional groups of a SAM material which may be relatively easily ionized when other layers are deposited on the SAM layer. The term "live ion" may also refer to a substituent, for example, amine or carboxylic acid, that may be ionized through either oxidation and/or reduction reactions depending on the environment(s) in which the SAM compound is utilized. Depending on the environment, the live ion will tend to supply a hydrogen ion ($H^+$) or remove a hydrogen ion ($H^+$).

BRIEF DESCRIPTION OF THE DRAWINGS

The features, elements and methods according to example embodiments will be more clearly understood from the following detailed description when considered in light of the accompanying drawings, in which.

Figure 1:
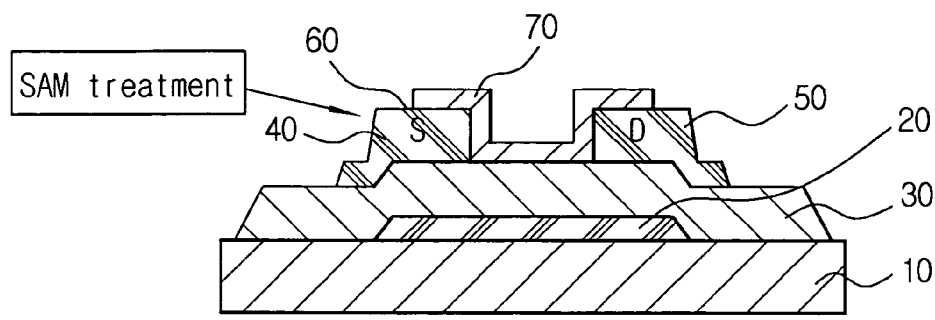
FIG. 1 is a schematic sectional view showing an example embodiment of an organic thin film transistor fabricated using a method according to an example embodiment.

It should be noted that these Figures are intended to illustrate the general characteristics of methods, structure and/or materials utilized in certain example embodiments and to supplement the written description provided below. These drawings are not, however, to scale and may not precisely reflect the precise structural characteristics of any given embodiment, and should not be interpreted as defining or limiting the range of values or properties encompassed by example embodiments. In particular, the relative thicknesses and positioning of layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Methods of fabricating organic thin film transistors comprising a substrate, a gate electrode, a gate insulating film, metal oxide source/drain electrodes, and an organic semiconductor layer according to example embodiments includes the surface treatment of the metal oxide source/drain electrodes and the insulating film with a live ion-containing SAM compound.

Organic thin film transistors fabricated according to method according to example embodiments, may have a bottom contact structure. When such a structure is utilized, the methods of fabricating the bottom contact type organic thin film transistor may include forming a gate electrode on a substrate, forming a gate insulating film on the gate electrode, forming metal oxide source/drain electrodes on the gate insulating film, forming an SAM on the metal oxide source/drain electrodes and the insulating film, and forming an organic semiconductor layer on the insulating film and the metal oxide source/drain electrodes.

When the SAM is being used in example embodiments to provide an increased work function in the metal oxide relative to the work function of a corresponding organic semiconductor material and thereby increase the charge mobility, a top gate type organic thin film transistor configuration may be utilized. Such a top gate type organic thin film transistor for an increase in charge mobility may be fabricated by forming metal oxide source/drain electrodes on a substrate, forming an SAM on the surface of the metal oxide source/drain electrodes, forming an organic semiconductor layer between the metal oxide source/drain electrodes, forming an insulating film on the organic semiconductor layer, and forming a gate electrode on the insulating film.

Alternatively, decreases in the hysteresis exhibited by the resulting device may be achieved by using a top contact type transistor configuration. Example embodiments of methods for fabricating such top contact type organic thin film transistors exhibiting reduced hysteresis include forming a gate electrode on a substrate, forming a gate insulating film on the gate electrode, forming an SAM on the gate insulating film, forming an organic semiconductor layer on the surface treated gate insulating film, and forming metal oxide source/drain electrodes on the insulating film and the organic semiconductor layer.

Example embodiments of methods that may be used in fabricating bottom contact type organic thin film transistors are discussed in additional detail below. Those skilled in the art will appreciate that the following discussion regarding the formation of the various structural elements may be applied equally to corresponding structures found in example embodiments of top gate type organic thin film transistors.

The substrate is typically washed to remove impurities after which a gate electrode pattern is formed on the substrate surface using a conventional sequence of deposition, patterning and etching. A range of insulating and/or semiconducting materials may be utilized in the substrate including, for example, glass, silicon, plastic and combinations thereof, but is not limited thereto. As will be appreciated by those skilled in the art, the fabrication process and the intended use of the finished devices will affect the selection of an appropriate substrate that provides a satisfactory combination of properties.

Example embodiments of organic thin film transistors may include gate electrodes fabricated from one or more conductors selected from a group consisting of metals, metal oxides, metal nitrides, metal suicides, metal alloys and/or conductive polymers typically used in the art. Metals that could be used for forming the gate electrodes include metals, for example, gold (Au), silver (Ag), aluminum (Al), nickel (Ni), molybdenum (Mo), tungsten (W), metal alloy oxides, for example, indium tin oxide (ITO), and conductive polymers, for example, polythiophene, polyaniline, polyacetylene, polypyrrole, polyphenylene vinylene, a mixture of PEDOT (polyethylenedioxythiophene) and PSS (polystyrenesulfonate) as well as mixtures and combinations thereof.

After the gate electrode is formed on the substrate, a gate insulating film may be formed on the gate electrode using any suitable or conventional process. Insulating materials that could be utilized in forming the gate insulating film include, but are not limited to, organic materials, for example, polyolefin, polyvinyl, polyacrylate, polystyrene, polyurethane, polyimide, polyvinylphenol, and mixtures, combinations and derivatives thereof, and inorganic materials, for example, silicon nitrides ($SiN_x(0<x<4)$), silicon dioxide ($SiO_2$) and aluminum oxide ($Al_2O_3$). Those skilled in the art will appreciate that the thickness and/or the dielectric strength of the gate insulating film may be adjusted, if necessary, to provide additional control over the performance of the resulting devices. Insulating materials include, for example, polymeric insulating materials combined with one or more cross-linking agents and/or organic-inorganic hybrid insulating material. As noted above, the thickness of the gate insulating film will affect the performance of the resulting devices and may, for example, be applied to a thickness of 3000~7000 Å. As will be appreciated by those skilled in the art, suitable insulating materials may be deposited or formed on the substrate using a variety of processes including, for example, vacuum depositions and/or solution processes to form the gate insulating film.

In some instances, polymeric insulating materials and/or other materials that may subsequently be subjected to one or more wet processes may, before or after formation, be subjected to an initial or "soft" bake and/or a secondary or "hard" bake to increase the durability of the materials. Example embodiments of such soft baking process for gate insulating materials include a soft bake at about 60 to 150° C. for about 1 to 10 minutes, after which the materials may then be subjected to a longer and/or higher temperature "hard" bake. Example embodiments of such a hard bake process include baking the gate insulating film at a bake temperature of about 100 to 200° C. for a hard bake period ranging from about 30 minutes to about 3 hours, if necessary.

Source and drain electrodes may then be formed on the gate insulating film are provided thereon using a metal oxide or other suitable material. Example embodiments of the fabrication include forming a thin conductive film on the gate insulating film by applying, for example, one or more metal oxides to the surface of the gate insulating film and then removing portions of the gate insulating layer using a conventional or other suitable process for patterning (exposing) a photosensitive layer formed on the conductive film and then removing, e.g., by etching with acetonitrile, those regions of the conductive film that are unprotected by the source/drain pattern. After the etching process has been complete, the photosensitive layer, e.g., a photoresist, is removed using, for example, a photoresist stripper, thereby exposing the remaining source/drain electrodes. Example embodiments of organic thin film transistors may utilize a variety of metal oxides in the source/drain electrodes including, for example, ITO (indium tin oxide) and IZO (indium zinc oxide) and may apply such metal oxides to the surface of the substrate by one or more processes including, for example, thermal evaporation, spin coating, roll coating, spray coating and printing.

After the metal oxide source/drain electrodes are formed, the metal oxide source/drain electrodes and the exposed regions of the insulating film may be subjected to a surface treatment using a live ion-containing SAM compound under conditions selected to promote formation of the SAM and the appropriate ionization state of the live ion. While the live ion-containing SAM is generally more easily adsorbed on the surface of the metal oxide source/drain electrodes through dehydrogenation of the binding group(s), indicated in the following Formulas II and III by the letter "Z," on the surface of the insulating film the SAM compound tends to react with hydrogen oxide radicals and ionized oxygen on the surface of the insulating film and is thereby adsorbed.

Example embodiments include a SAM in which the live ion group of the SAM is exposed outside of the organic semiconductor layer, the live ion group can improve control of the ion supply as a function of the applied electric charge, thereby reducing hysteresis caused by the interlayer properties between the insulating layer and the semiconductor layer, which is regarded as a major characteristic of example embodiments.

Example embodiments of live ion-containing SAM compounds that can be used in practicing example embodiments of the methods disclosed include, but are not particularly limited to, compounds represented by Formulas I, II and III below:

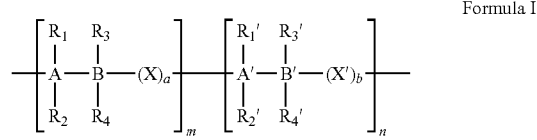

Formula I wherein m, n, a and b are each integers that satisfy the expressions $0<m\leq10,000; 0\leq n<10,000; 0\leq a\leq 20$ and $0\leq b\leq 20$;

wherein A, B, A' and B' are each independently selected from a group consisting of C, Si, Ge, Sn, and Pb;

wherein $R_1$, $R_2$, $R_3$, $R_4$, $R_1'$, $R_2'$, $R_3'$ and $R_4'$ are each independently selected from a group consisting of hydrogen, halogen, a nitro group, substituted and unsubstituted amino groups, cyano groups, substituted and unsubstituted $C_1$-$C_{30}$ alkyl groups, substituted and unsubstituted $C_1$-$C_{30}$ heteroalkyl groups, substituted and unsubstituted $C_1$-$C_{30}$ alkoxy groups, a substituted and unsubstituted $C_1$-$C_{30}$ heteroalkoxy group, substituted and unsubstituted $C_6$-$C_{30}$ aryl groups, substituted and unsubstituted $C_6$-$C_{30}$ arylalkyl groups, substituted and unsubstituted $C_6$-$C_{30}$ aryloxy groups, substituted and unsubstituted $C_6$-$C_{30}$ heteroaryl groups, substituted and unsubstituted $C_6$-$C_{30}$ heteroarylalkyl groups, substituted and unsubstituted $C_6$-$C_{30}$ heteroaryloxy groups, substituted and unsubstituted $C_6$-$C_{20}$ cycloalkyl groups, substituted and unsubstituted $C_2$-$C_{30}$ heterocycloalkyl groups, substituted and unsubstituted $C_1$-$C_{30}$ alkylester groups, substituted and unsubstituted $C_1$-$C_{30}$ heteroalkylester groups, substituted and unsubstituted $C_6$-$C_{30}$ arylester groups, and substituted and unsubstituted $C_6$-$C_{30}$ heteroarylester groups, and further wherein at least one of $R_1$, $R_2$, $R_3$ and $R_4$ is selected from a group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$, and at least one of $R_1$, $R_2$, $R_3$ and $R_4$ contains a live ion; and wherein X and X' are each independently selected from the group consisting of a single bond, O, N, S, substituted and unsubstituted $C_1$-$C_{30}$ alkylene groups, substituted and unsubstituted $C_1$-$C_{30}$ heteroalkylene groups, substituted and unsubstituted $C_6$-$C_{30}$ arylene groups, substituted and unsubstituted $C_6$-$C_{30}$ arylalkylene groups, substituted and unsubstituted $C_6$-$C_{30}$ heteroarylene groups, substituted and unsubstituted $C_6$-$C_{30}$ heteroarylalkylene groups, substituted and unsubstituted $C_6$-$C_{20}$ cycloalkylene groups, substituted and unsubstituted $C_6$-$C_{30}$ heterocycloalkylene groups, substituted and unsubstituted $C_6$-$C_{30}$ arylester groups and substituted and unsubstituted $C_6$-$C_{30}$ heteroarylester groups; and/or

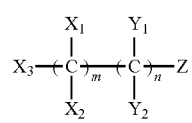

Formula II wherein m is an integer from 0 to 10,000, and n is an integer from 1 to 10,000;

wherein $X_1$, $X_2$, $X_3$, $Y_1$, and $Y_2$ are each independently selected from a group consisting of hydrogen, fluorine, substituted and unsubstituted $C_6$-$C_{30}$ aromatic groups and substituted and unsubstituted $C_5$-$C_{30}$ heteroaromatic groups having a heterogeneous atom included in an aromatic ring, and further wherein the substituted aromatic group(s) and/or substituted heteroaromatic group(s) are independently substituted with at least one substituent selected from a group consisting of $C_1$-$C_{12}$ alkyl groups, alkoxy groups, ester groups, carboxyl groups, thiol groups, and amine groups;

wherein at least one of $X_1$, $X_2$, $X_3$, $Y_1$ and $Y_2$ contains a live ion; and wherein Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$; and/or

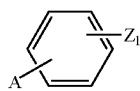

Formula III wherein A is selected from a group consisting of hydrogen, fluorine, $C_1$-$C_{12}$ alkyl groups, a $C_6$-$C_{30}$ aromatic group and a $C_5$-$C_{30}$ heteroaromatic group having a heterogeneous atom included in an aromatic ring, the aromatic group or heteroaromatic group containing at least one live ion, 1 is an integer from 1 to 5, and Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$.

Further, the $C_1$-$C_{12}$ alkyl group may include at least one selected from the group consisting of fluorine, an alkoxy group, an ester group, a carboxyl group, a thiol group, and an amine group.

As used herein, the term "alkyl" refers to linear and branched hydrocarbons, including, for example, methyl, ethyl, propyl, iso-butyl, sec-butyl, tert-butyl, pentyl, iso-amyl, hexyl, and others well known to those skilled in the art. Further, one or more of the hydrogen atoms present in the base alkyl group may be independently substituted by a member selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "heteroalkyl" refers to radicals formed by replacing one or more carbon atoms, typically 1-5 carbon atoms, of the main chain of the base alkyl group with a hetero atom, for example, oxygen, sulfur, nitrogen or phosphorus.

As used herein, the term "aryl" refers to an aromatic carbocyclic system having one or more aromatic rings, the rings being attached or fused together through a pendent process. Specific examples of such aryl groups include aromatic groups, for example, phenyl, naphthyl and tetrahydronaphthyl groups. Further, one or more of the hydrogen atoms of the base aryl group may be independently substituted by a member of a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "heteroaryl" refers to a 5- to 30-membered aromatic ring system having 1-3 hetero atoms selected from a group consisting of N, O, P and S, and the remaining ring atoms being C, the rings being attached or fused together through a pendent process. Further, one or more hydrogen atoms of the base heteroaryl group may be independently substituted with a member selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "alkoxy" refers to radical-O-alkyl, in which the alkyl is defined as above. Specific examples of such structures include methoxy, ethoxy, propoxy, iso-butyloxy, sec-butyloxy, pentyloxy, iso-amyloxy, hexyloxy and others well known to those skilled in the art. Further, one or more hydrogen atoms of the alkoxy group may be substituted with a member independently selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "heteroalkoxy" refers to structures in which at least one of the base carbons of the corresponding alkoxy group has been replaced by one or more hetero atoms selected from a group consisting of oxygen, sulfur or nitrogen. Examples of such groups and compounds include $CH_3CH_2OCH_2CH_2O-$, $C_4H_9OCH_2CH_2OCH_2CH_2O-$ and $CH_3O(CH_2CH_2O)_nH$.

As used herein, the term "arylalkyl" refers to radicals formed by replacing some of the hydrogen atoms of the aryl group defined above with a lower alkyl radical, for example, methyl, ethyl, propyl and others well known to those skilled in the art, including, for example, benzyl and phenylethyl. Further, one or more hydrogen atoms of the arylalkyl group may be independently substituted with a member selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "heteroarylalkyl" refers to radicals formed by replacing one or more of the hydrogen atoms of the heteroaryl group defined above with a lower alkyl radical, for example, methyl, ethyl, propyl and others well known to those skilled in the art. Further, one or more hydrogen atoms of the heteroarylalkyl group may be independently substituted with a member selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "aryloxy" refers to radical-O-aryls, the aryl being defined as above. Specific examples thereof include phenoxy, naphthoxy, anthracenyloxy, phenanthrenyloxy, fluorenyloxy and indenyloxy. Further, one or more hydrogen atoms of the aryloxy group may be independently substituted with a member selected from a group consisting of halogens, hydroxyl groups, nitro groups, cyano groups, amino groups (for example, $-NH_2$, $-NH(R)$ and $-N(R')(R'')$ wherein R, R' and R" are each independently selected from a group consisting of C1-C10 alkyl groups), amidino groups, hydrazine and hydrazone groups.

As used herein, the term "heteroaryloxy" refers to radical-O-heteroaryls, the heteroaryl being defined as above. Specific examples of such base heteroaryloxy groups include, for example, benzyloxy and phenylethyloxy. Further, one or more of the hydrogen atoms present in the base heteroaryloxy group thereof may be independently substituted with a member selected from a group consisting of halogens, hydroxyl groups, nitro groups, cyano groups, amino groups (for example, $—NH_2$, $—NH(R)$ and $—N(R')(R'')$ wherein R, R' and R" are each independently selected from a group consisting of C1-C10 alkyl groups), amidino groups, hydrazine and hydrazone groups.

As used herein, the term "cycloalkyl" refers to a monovalent monocyclic system having from 5 to 30 carbon atoms. Further, one or more of the hydrogen atoms of the base cycloalkyl group may be independently substituted with a member selected from a group consisting of halogens, hydroxyl groups, nitro groups, cyano groups, amino groups (for example, $—NH_2$, $—NH(R)$ and $—N(R')(R'')$ wherein R, R' and R" are each independently selected from a group consisting of C1-C10 alkyl groups), amidino groups, hydrazine and hydrazone groups.

As used herein, the term "heterocycloalkyl" refers to $C_5$-$C_{30}$-membered monovalent monocyclic systems in which 1, 2 or 3 of the carbons present in the base structure are replaced with hetero atoms independently selected from among N, O, P and S, with the remaining ring atoms being C. Further, one or more hydrogen atoms of the heterocycloalkyl group may be independently substituted with a member selected from a group consisting of halogens, hydroxyl groups, nitro groups, cyano groups, amino groups (for example, $—NH_2$, $—NH(R)$ and $—N(R')(R'')$ wherein R, R' and R" are each independently selected from a group consisting of C1-C10 alkyl groups), amidino groups, hydrazine and hydrazone groups.

As used herein, the term "alkylester" refers to functional groups exhibiting the combination of an alkyl group and an ester group in which the alkyl group is defined as above. As used herein, the term "heteroalkylester" refers to functional groups exhibiting the combination of a heteroalkyl group and an ester group in which the heteroalkyl group is defined as above. As used herein, the term "arylester" refers to a functional group having a combination of an aryl group and an ester group in which the aryl group is defined as above. As used herein, the term "heteroarylester" refers to a functional group having a combination of a heteroaryl group and an ester group in which the heteroaryl group is defined as above.

As used herein, the term "amino" encompasses substituted and unsubstituted amino groups, which may be represented as $—NH_2$, $—NH(R)$ and $—N(R')(R'')$, wherein R, R' and R" are each independently selected from $C_1$-$C_{10}$ alkyl groups. One or more of the hydrogen atoms contained in the base functional groups may further be substituted with a halogen atom, for example, fluorine.

The live ion contained in the SAM compound represented by any one of Formulas I, II and III may include at least one selected from among $NH_2$, $N(Me)_nH_{n-1}$, $N(CH_2)_nH_{n-1}$, $SO_3H$, $PO_3H$, $COOH$, $COON_a$, $COOK$ and $COONH_4$, wherein n is an integer selected from a group consisting of 1 and 2.

Figure 2:
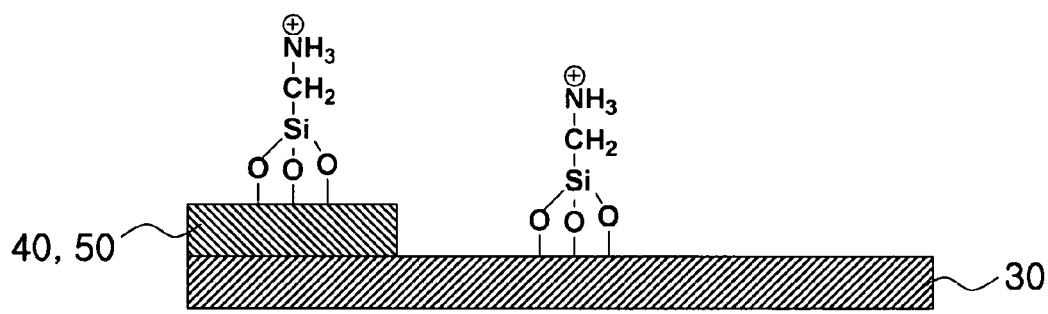
FIG. 2 is a schematic view illustrating the live ion as used in methods according to example embodiments.

Example embodiment SAM compounds exhibit an improved combination of bondability to the surface of metal oxides and adsorption to the surface of the gate insulating film. Thus, when the surface of the gate insulating film 30 having the metal oxide source/drain electrodes 40, 50 formed thereon is treated with a SAM compound having a structure in accord with example embodiments, the SAM compound will bind to the surface of the metal oxide source/drain electrodes 40, 50, forming a SAM 60 as shown in FIG. 2, whereby the properties and work function of the source/drain electrodes will be changed in a manner that increases the charge mobility. The SAM compound will also bind to the gate insulating film 30, thereby improving the properties of the insulating film and decreasing the hysteresis exhibited by the organic insulator.

The surface treatment of the metal oxide source/drain electrodes with the SAM compound may be conducted using a solution obtained by dissolving the live ion-containing SAM compound in a solvent or solvent system selected from a group consisting of water, organic solvents and combinations and mixtures thereof. The surface treatment may be achieved by, for example, immersing the metal oxide source/drain electrodes in a SAM compound solution that is maintained within a treatment temperature range for a treatment period sufficient to obtain a SAM exhibiting acceptable properties, for example, thickness and uniformity. As will be appreciated by those skilled in the art, the metal oxide source/drain electrodes can be exposed to the SAM compound solution using any suitable technique including, for example, spraying, puddling or dipping, capable of providing the degree of exposure necessary to achieve the desired SAM.

Examples of the organic solvents expected to be useful in example embodiments include, but are not limited to, alcohols, for example, ethanol, ethers, chlorine-based alkanes, aromatics, and glycols. Example embodiments of the SAM compound solutions will typically include 0.001-20 wt % of the live ion-containing SAM compound. The surface treatment of the metal oxide source/drain electrodes with the SAM compound solution may be conducted at 10-150° C. for a treatment period of from 1 min to 1 hour.

After formation of the SAM, an organic semiconductor material may be applied to the metal oxide source/drain electrodes using a conventional coating process, to obtain an organic semiconductor layer. Example embodiments may be fabricated using a range of organic semiconductor materials for forming the organic semiconductor layer including, for example, pentacene, tetracene, copper phthalocyanine, polythiophene, polyaniline, polyacetylene, polypyrrole, polyphenylenevinylene and mixtures, combinations and derivatives thereof. Example embodiments provide for the organic semiconductor material(s) to be applied using a variety of techniques and processes including, for example, thermal evaporation, screen printing, printing, spin coating, dip coating, ink jetting, etc.

Other example embodiments may incorporate one or more surface preparation processes including, for example, subjecting the surface of the metal oxide source/drain electrodes to acid treatment and or UV ozone treatment to form a prepared or sensitized surface. The SAM compound solution is then applied to the prepared surface(s) for forming the SAM on the surface of the metal oxide source/drain electrodes using a live ion-containing SAM compound. Without being bound by theory, it is believed that the pre-treatment of the electrodes using an acid treatment, a UV ozone treatment or other suitable treatment increases the hydrophilic properties of the surfaces, thereby increasing the adsorption of the SAM compound by the surface of the metal oxide and/or increasing the surface adsorption ability of the live ion.

Example embodiments of acid treatments include dipping or otherwise exposing the surface of the metal oxide source/drain electrodes to an organic acid solution or an inorganic acid solution maintained at a treatment temperature of 15-35° C. for a treatment period of, for example, 0.5-10 seconds.

Examples of the organic acid that may be used in example embodiments include, for example, acids that may be represented by Formula IV below:

RCOOH    Formula IV wherein R is selected from among $C_1$-$C_{12}$ alkyl groups, alkenyl groups, alkynyl groups, $C_3$-$C_{30}$ cycloalkyl groups, $C_6$-$C_{30}$ aryl groups, and fluorine-substituted functional groups thereof. Examples of the inorganic acid which may be useful in example embodiments include, for example, HI, HBr, HCl, HF, $HNO_3$, $H_3PO_4$, $H_2SO_4$, and mixtures thereof. Such mixtures may include, for example, conventional ITO etchants comprising a combination of hydrochloric (HCl) and nitric ($HNO_3$) acids.

A UV ozone treatment compatible with example embodiments may include irradiating the surface of the metal oxide source/drain electrodes with light energy on the order of 0.28 W/cm$^2$ at a wavelength of 254 nm for a treatment period of 1-30 minutes during which the surfaces will be exposed to ozone.

Further, example embodiments of the methods of fabricating the organic thin film transistor may also include annealing the surface of the metal oxide source/drain electrodes, after treating the surface of the source/drain electrodes with the SAM compound. When the surface treated metal oxide source/drain electrodes are annealed, the adhesion of the SAM to the source/drain electrodes increases, thereby producing transistors that may exhibit charge mobilities greater than those achieved by transistors subjected only to surface treatment using the SAM compound. The annealing process may be conducted at 50-200° C. for an anneal period ranging from 10 minute to 1 hour.

Example embodiments of methods of fabricating organic thin film transistors may also include subjecting the surface of the metal oxide source/drain electrodes to acid treatment and/or UV ozone treatment, followed by surface treatment using the live ion-containing SAM compound solution, and finally to annealing.

Organic thin film transistors fabricated using example embodiments of the fabrication methods described above utilize a bottom contact type configuration and comprise a gate electrode 20, a gate insulating film 30, metal oxide source/drain electrodes 40, 50, a SAM 60, and an organic semiconductor layer 70, each of which was sequentially formed on the substrate 10. As detailed above, organic thin film transistors fabricated using example embodiments of the fabrication method have source/drain electrodes exhibiting hydrophilic properties. Further, the addition of the SAM is sufficient to increase the work function of the metal oxide constituting the source/drain electrodes to a level above that exhibited by the organic semiconductor material, thereby increasing charge mobility and reducing hysteresis and improving the stability of the organic thin film transistor.

The organic thin film transistors fabricated using an example embodiment of a method as described above can be useful in display devices applications including, for example, electroluminescent devices, liquid crystal devices and electrophoretic devices.

Certain example embodiments are detailed below to assist those skilled in the art in developing a better and more complete understanding of the scope of methods and structures disclosed herein. As will be appreciated by those skilled in the art, the following examples are set forth only to illustrate and are not to be construed in a manner that unduly limits the scope of the disclosure.

EXAMPLE 1

A 1500 Å layer of aluminum (Al) was sputtered onto a washed glass substrate, patterned and etched to form a gate electrode pattern on the substrate. A silanol organic-inorganic hybrid insulator was applied to the substrate using spin coating at 200 rpm to form a gate insulating film 7000 Å thick. The gate insulating film was then subjected to a soft bake at 70° C. for 10 minutes followed by a hard bake at 150° C. for 90 minutes, thereby forming an insulating film on the gate electrode.

A 1000 Å layer of indium-tin-oxide ("ITO") was then deposited on the insulating film using a thermal evaporation process under vacuum conditions (for example, a pressure of 2×10$^{-7}$ torr and a substrate temperature 50° C., thereby achieving a deposition rate of 0.85 Å/second). The ITO layer was subsequently patterned and etched to obtain an ITO electrode pattern, after which the etch pattern was removed to expose the upper surfaces of the ITO electrode pattern. The ITO electrode pattern was then dipped into an SAM compound solution of 0.25 wt % amine methoxy silane (available from Aldrich) in a lower fatty acid-mixed alcohol solvent (methanol:ethanol=1:1 (vol/vol)) at room temperature for 5 minutes to treat the exposed surfaces. A solution of 0.1 wt % poly-3-hexylthiophene dissolved in dichlorobenzene was then applied to the substrate and subjected to a spin coating operation at 100 rpm to form an organic film having a thickness of about 500 Å thick. The organic film was then subjected to a heat treatment at 100° C. for 15 minutes to obtain an organic semiconductor layer and complete the basic organic thin film transistor structure as illustrated in FIG. 1.

EXAMPLE 2

An organic thin film transistor was fabricated in the same manner as in Example 1, with the exception that the surface of the ITO electrode pattern was subjected to an acid treatment at room temperature (approximately 25° C.) for 10 seconds using an ITO etchant. The surface treatment with the SAM compound solution and the formation of the organic semiconductor layer then proceeded as detailed in Example 1.

EXAMPLE 3

An organic thin film transistor was fabricated in the same manner as in Example 1, with the exception that the ITO electrode was subjected to the surface treatment and then annealed at 120° C. for 15 min.

COMPARATIVE EXAMPLE 1

An organic thin film transistor was fabricated in the same manner as described above with respect to Example 1, with the exception that the ITO electrode was not treated with the SAM compound.

COMPARATIVE EXAMPLE 2

An organic thin film transistor was fabricated in the same manner as described above with respect to Example 2, with the exception that the ITO electrode was not treated with the SAM compound.

EXPERIMENTAL EXAMPLE 1

In order to evaluate the properties of the source/drain electrodes and the gate insulating film through the surface treatment using the SAM compound, the organic thin film transistors fabricated according to the methods described above in Examples 1-3 and Comparative Examples 1 and 2 were measured with respect to maximum current in on-state ($I_{on}$), minimum current in off-state ($I_{off}$), $I_{on}/I_{off}$, and hysteresis. The results of these measurements are provided in TABLE 1 below.

The $I_{on}/I_{off}$ ratio was determined from the ratio of the maximum current in the on-state to the minimum current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$ is the maximum current, $I_{off}$ is off-state leakage current, $\mu$ is charge mobility, $\sigma$ is conductivity of the thin film, q is the quantity of electric charge, $N_A$ is the density of electric charge, t is the thickness of the semiconductor film, $C_o$ is the capacitance of the insulating film, and $V_D$ is the drain voltage.

In addition, hysteresis was determined using the difference between threshold voltages at forward steep and backward steep.

TABLE 1

| No. | $I_{on}$ (A) | $I_{off}$ (A) | $I_{on}/I_{off}$ | Hysteresis (V) |
|---|---|---|---|---|
| Ex. 1 | 1.54E−07 | 6.88E−11 | 2.24E+03 | 9 |
| Ex. 2 | 8.85E−08 | 9.84E−12 | 8.99E+03 | 8 |
| Ex. 3 | 2.26E−07 | 8.70E−12 | 2.60E+04 | 9 |
| C. Ex. 1 | 4.50E−08 | 7.30E−12 | 6.16E+03 | 14 |
| C. Ex. 2 | 5.89E−08 | 6.34E−12 | 9.29E+03 | 16 |

As is apparent from the data provided in TABLE 1, the SAM compound used in the surface treatments of example embodiments is adsorbed on the surface of the metal oxide source/drain electrodes to a degree sufficient to change the properties of the source/drain electrodes, for example, the $I_{on}/I_{off}$ ratio. It is also apparent from the data presented in TABLE 1 that the SAM compound was also bound to the surface of the gate insulating film to a degree sufficient to reduce the hysteresis exhibited by the gate insulating film.

EXPERIMENTAL EXAMPLE 2

Figure 3:
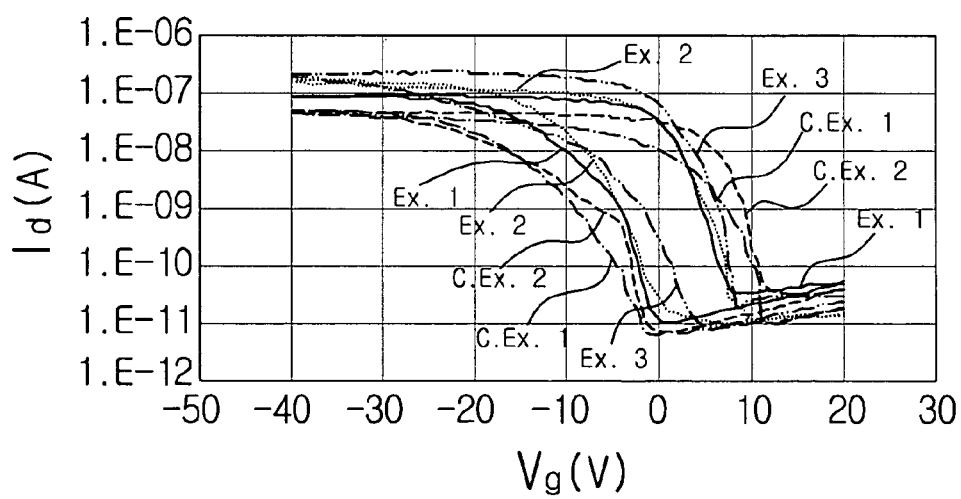
FIG. 3 is a graph showing the current transfer properties of example embodiments of organic thin film transistors fabricated according to Examples 1 to 3 and Comparative Examples 1 and 2.

The current transfer properties of the organic thin film transistors fabricated in accord with Examples 1-3 and Comparative Examples 1 and 2 were then evaluated using a semiconductor analyzer (4200-SCS), available from KEITHLEY Co. Ltd. The results of this evaluation are shown in FIG. 3.

The electrical properties of the organic thin film transistors fabricated in Examples 1-3 and Comparative Examples 1 and 2, including the charge mobilities provided below in TABLE 2, were calculated using the following equations for the saturation region. That is, the current equation for the saturation region was converted into a graph of $(I_{SD})^{1/2}$ to $V_G$, while the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, $\mu$ or $\mu_{FET}$ is charge mobility, $C_o$ is oxide film capacitance, W is a channel width, L is a channel length, $V_G$ is a gate voltage, and $V_T$ is a threshold voltage.

TABLE 2

| Example Number | Charge Mobility (cm²/V · sec) |
|---|---|
| Ex. 1 | 0.0225 |
| Ex. 2 | 0.0229 |
| Ex. 3 | 0.0258 |
| C. Ex. 1 | 0.0036 |
| C. Ex. 2 | 0.0053 |

As is apparent from the data presented in TABLE 2, organic thin film transistors fabricated using the method in accord with example embodiments detailed herein exhibit improved electrical properties, particularly including charge mobility, over corresponding organic thin film transistors that do not incorporate a SAM providing a live ion.

As described above, example embodiments detailed above provide methods for fabricating organic thin film transistors and organic thin film transistors fabricated by such methods that exhibit improved performance, particularly reduced hysteresis and increased charge mobility. According to the methods detailed above, the work function of metal oxides constituting source/drain electrodes can be increased to a level above the work function of associated organic semiconductor materials, thereby providing organic thin film transistors exhibiting improved charge mobility, improved gate insulating film properties, and decreased hysteresis associated with organic insulators.

Although certain example embodiments have been described herein with reference to particular materials and structures, these example embodiments are not intended to, and should not be considered to, unduly limit the scope of the embodiments encompassed by the disclosure. Accordingly, those skilled in the art will appreciate that various modifications of the structures, materials and processes are possible, without departing from the scope of the disclosure defined by these example embodiments.

What is claimed is:

1. A method of fabricating an organic thin film transistor having a substrate, a gate electrode and a gate insulating film comprising:
   forming metal oxide electrodes on the gate insulating film;
   exposing a surface of the metal oxide electrodes to a quantity of a self-assembled monolayer compound containing a live ion to obtain surface modified electrodes; and
   forming an organic semiconductor layer on the surface modified electrodes,
   wherein the self-assembled monolayer compound containing the live ion corresponds to a general Formula I,

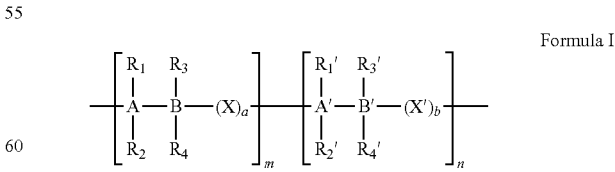

Formula I wherein m, n, a and b are each integers that satisfy the expressions 0<m≦10,000; 0≦n<10,000; 0≦a≦20 and 0≦b≦20;

wherein A, B, A' and B' are each independently selected from a group consisting of C, Si, Ge, Sn, and Pb;

wherein $R_1$, $R_2$, $R_3$, $R_4$, $R_1'$, $R_2'$, $R_3'$ and $R_4'$ are each independently selected from a group consisting of hydrogen, halogen, a nitro group, substituted and unsubstituted amino groups, cyano groups, substituted and unsubstituted $C_1$-$C_{30}$ alkyl groups, substituted and unsubstituted $C_1$-$C_{30}$ heteroalkyl groups, substituted and unsubstituted $C_1$-$C_{30}$ alkoxy groups, a substituted and unsubstituted $C_1$-$C_{30}$ heteroalkoxy group, substituted and unsubstituted $C_6$-$C_{30}$ aryl groups, substituted and unsubstituted $C_6$-$C_{30}$ arylalkyl groups, substituted and unsubstituted $C_6$-$C_{30}$ aryloxy groups, substituted and unsubstituted $C_6$-$C_{30}$ heteroaryl groups, substituted and unsubstituted $C_6$-$C_{30}$ heteroarylalkyl groups, substituted and unsubstituted $C_6$-$C_{30}$ heteroaryloxy groups, substituted and unsubstituted $C_6$-$C_{20}$ cycloalkyl groups, substituted and unsubstituted $C_2$-$C_{30}$ heterocycloalkyl groups, substituted and unsubstituted $C_1$-$C_{30}$ alkylester groups, substituted and unsubstituted $C_1$-$C_{30}$ heteroalkylester groups, substituted and unsubstituted $C_6$-$C_{30}$ arylester groups, and substituted and unsubstituted $C_6$-$C_{30}$ heteroarylester groups, and further wherein at least one of $R_1$, $R_2$, $R_3$ and $R_4$ is selected from a group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$, and at least one of $R_1$, $R_2$, $R_3$ and $R_4$ contains a live ion; and wherein X and X' are each independently selected from the group consisting of a single bond, O, N, S, substituted and unsubstituted $C_1$-$C_{30}$ alkylene groups, substituted and unsubstituted $C_1$-$C_{30}$ heteroalkylene groups, substituted and unsubstituted $C_6$-$C_{30}$ arylene groups, substituted and unsubstituted $C_6$-$C_{30}$ arylalkylene groups, substituted and unsubstituted $C_6$-$C_{30}$ heteroarylene groups, substituted and unsubstituted $C_6$-$C_{30}$ heteroarylalkylene groups, substituted and unsubstituted $C_6$-$C_{20}$ cycloalkylene groups, substituted and unsubstituted $C_6$-$C_{30}$ heterocycloalkylene groups, substituted and unsubstituted $C_6$-$C_{30}$ arylester groups and substituted and unsubstituted $C_6$-$C_{30}$ heteroarylester groups;

a general Formula II:

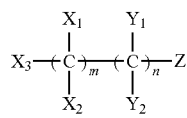

Formula II wherein m is an integer from 0 to 10,000, and n is an integer from 1 to 10,000;

wherein $X_1$, $X_2$, $X_3$, $Y_1$, and $Y_2$ are each independently selected from a group consisting of hydrogen, fluorine, substituted and unsubstituted $C_6$-$C_{30}$ aromatic groups and substituted and unsubstituted $C_5$-$C_{30}$ heteroaromatic groups having a heterogeneous atom included in an aromatic ring, and further wherein the substituted aromatic group(s) and/or substituted heteroaromatic group(s) are independently substituted with at least one substituent selected from a group consisting of $C_1$-$C_{12}$ alkyl groups, alkoxy groups, ester groups, carboxyl groups, thiol groups, and amine groups;

wherein at least one of $X_1$, $X_2$, $X_3$, $Y_1$ and $Y_2$ contains a live ion; and wherein Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$; or a general Formula III

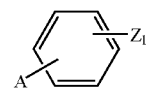

Formula III wherein A is selected from a group consisting of hydrogen, fluorine, substituted and unsubstituted $C_1$-$C_{12}$ alkyl groups, a $C_6$-$C_{30}$ aromatic group and a $C_5$-$C_{30}$ heteroaromatic group having a heterogeneous atom included in an aromatic ring, the aromatic group or heteroaromatic group containing at least one live ion, 1 is an integer from 1 to 5, and Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$.

2. The method of fabricating an organic thin film transistor according to claim 1, wherein:

the self-assembled monolayer compound includes a live ion selected from a group consisting of $NH_2$, $N(Me)_nH_{n-1}$, $N(CH2)_nH_{n-1}$, $SO_3H$, $PO_3H$, COOH, COONa, COOK, $COONH_4$ and mixtures thereof, and further wherein n is an integer selected from a group consisting of 1 and 2.

3. The method of fabricating an organic thin film transistor according to claim 1, wherein:

the self-assembled monolayer compound corresponds to general Formula III and further wherein A is a substituted $C_1$-$C_{12}$ alkyl group including a substituent selected from a group consisting of fluorine, alkoxy groups, ester groups, carboxyl groups, thiol groups, amine groups and combinations thereof.

4. The method of fabricating an organic thin film transistor according to claim 1, wherein exposing the surface of the metal oxide electrodes to the self-assembled monolayer compound further comprises:

dissolving the self-assembled monolayer compound in a solvent or solvent system selected from a group consisting of water, organic solvents and mixtures and combinations thereof to obtain a solution;

applying the solution to the electrodes using a technique selected from a group consisting of dipping, spraying, and puddling.

5. The method of fabricating an organic thin film transistor according to claim 4, wherein:

the solution includes 0.001-20 wt % of the self-assembled monolayer compound.

6. The method of fabricating an organic thin film transistor according to claim 4, wherein:

the solution includes an organic solvent selected from a group consisting of alcohols, ethers, chlorine-based alkanes, aromatics, glycols and mixtures thereof.

7. The method of fabricating an organic thin film transistor according to claim 4, wherein:

the solution is applied to the electrodes by immersing the electrodes in the solution for a period of 1 to 60 minutes while maintaining the solution at a temperature of 10 to 150° C.

8. The method of fabricating an organic thin film transistor according to claim 1, further comprising:

subjecting the surface of the metal oxide electrodes to a pretreatment selected from a group consisting of acid treatment, UV ozone treatment and a combination thereof, before exposing the surface of the metal oxide electrodes to the self-assembled monolayer compound.

9. The method of fabricating an organic thin film transistor according to claim 8, wherein:
the pretreatment includes exposing the surface of the metal oxide electrodes to an acid solution maintained at 15-35° C. for a period of 0.5-10 seconds.

10. The method of fabricating an organic thin film transistor according to claim 8, wherein:
the pretreatment includes the UV ozone treatment and includes irradiating the surface of the metal oxide electrodes with UV light of sufficient energy and frequency to generate ozone from ambient oxygen; and
exposing the surface of the metal oxide electrodes to the ozone for a period of 1-30 minutes.

11. The method of fabricating an organic thin film transistor according to claim 8, further comprising:
annealing the surface modified electrodes.

12. The method of fabricating an organic thin film transistor according to claim 1, further comprising:
annealing the surface modified electrodes.

13. The method of fabricating an organic thin film transistor according to claim 12, wherein:
the annealing is conducted at a temperature of 50-200° C. for an anneal period of 10-60 minutes.

14. The method of fabricating an organic thin film transistor according to claim 1, wherein:
the substrate is formed from a material selected from a group consisting of glass, silicon, plastic and combinations thereof.

15. The method of fabricating an organic thin film transistor according to claim 1, wherein:
the gate electrode comprises a material selected from a group consisting of gold (Au), silver (Ag), aluminum (Al), nickel (Ni), molybdenum (Mo), tungsten (W), indium tin oxide (ITO), polythiophene, polyaniline, polyacetylene, polypyrrole, polyphenylene vinylene, a PEDOT/PSS mixture (polyethylenedioxythiophene/polystyrenesulfonate) and combinations thereof.

16. The method of fabricating an organic thin film transistor according to claim 1, wherein:
the gate insulating film is a material selected from a group consisting of organic insulating materials, inorganic materials and combinations and mixtures thereof.

17. The method of fabricating an organic thin film transistor according to claim 1, wherein:
the metal oxide electrodes are formed of material selected from a group consisting of indium tin oxide (ITO), indium zinc oxide (IZO) and combinations and mixtures thereof.

18. The method of fabricating an organic thin film transistor according to claim 1, wherein:
the organic semiconductor layer is formed of material selected from a group consisting of pentacene, tetracene, copper phthalocyanine, polythiophene, polyaniline, polyacetylene, polypyrrole, polyphenylene, vinylene, and mixtures and derivatives thereof.

19. An organic thin film transistor comprising:
a substrate,
a gate electrode formed on the substrate;
a gate insulating film formed on the gate electrode;
metal oxide electrodes formed on the gate insulating film, the metal gate oxide electrodes having a first work function $\Phi_1$;
a self-assembled monolayer formed on the metal oxide electrodes and on exposed regions of the gate insulating film, wherein the self-assembled monolayer contains a plurality of live ions sufficient to produce an enhanced first work function $\Phi_1$.; and
an organic semiconductor layer formed on the self-assembled monolayer, the organic semiconductor layer having a second work function $\Phi_2$, wherein the expressions $\Phi_1 < \Phi_2$ and $\Phi_1 > \Phi_2$ are satisfied,
wherein the self-assembled monolayer is a monolayer of a self-assembled monolayer compound corresponding to a general Formula I, $$\left[ \begin{array}{cc} R_1 & R_3 \\ | & | \\ A\!-\!B \\ | & | \\ R_2 & R_4 \end{array}\!-\!(X)_a \right]_m \!\!\!\left[ \begin{array}{cc} R_1' & R_3' \\ | & | \\ A'\!-\!B' \\ | & | \\ R_2' & R_4' \end{array}\!-\!(X')_b \right]_n$$

Formula I wherein m, n, a and b are each integers that satisfy the expressions $0 < m \leq 10{,}000$; $0 \leq n < 10{,}000$; $0 \leq a \leq 20$ and $0 \leq b \leq 20$;

wherein A, B, A' and B' are each independently selected from a group consisting of C, Si, Ge, Sn, and Pb;

wherein $R_1$, $R_2$, $R_3$, $R_4$, $R_1'$, $R_2'$, $R_3'$ and $R_4'$ are each independently selected from a group consisting of hydrogen, halogen, a nitro group, substituted and unsubstituted amino groups, cyano groups, substituted and unsubstituted $C_1$-$C_{30}$ alkyl groups, substituted and unsubstituted $C_1$-$C_{30}$ heteroalkyl groups, substituted and unsubstituted $C_1$-$C_{30}$ alkoxy groups, a substituted and unsubstituted $C_1$-$C_{30}$ heteroalkoxy group, substituted and unsubstituted $C_6$-$C_{30}$ aryl groups, substituted and unsubstituted $C_6$-$C_{30}$ arylalkyl groups, substituted and unsubstituted $C_6$-$C_{30}$ aryloxy groups, substituted and unsubstituted $C_6$-$C_{30}$ heteroaryl groups, substituted and unsubstituted $C_6$-$C_{30}$ heteroarylalkyl groups, substituted and unsubstituted $C_6$-$C_{30}$ heteroaryloxy groups, substituted and unsubstituted $C_6$-$C_{20}$ cycloalkyl groups, substituted and unsubstituted $C_2$-$C_{30}$ heterocycloalkyl groups, substituted and unsubstituted $C_1$-$C_{30}$ alkylester groups, substituted and unsubstituted $C_1$-$C_{30}$ heteroalkylester groups, substituted and unsubstituted $C_6$-$C_{30}$ arylester groups, and substituted and unsubstituted $C_6$-$C_{30}$ heteroarylester groups, and further wherein at least one of $R_1$, $R_2$, $R_3$ and $R_4$ is selected from a group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$, and at least one of $R_1$, $R_2$, $R_3$ and $R_4$ contains a live ion; and wherein X and X' are each independently selected from the group consisting of a single bond, O, N, S, substituted and unsubstituted $C_1$-$C_{30}$ alkylene groups, substituted and unsubstituted $C_1$-$C_{30}$ heteroalkylene groups, substituted and unsubstituted $C_6$-$C_{30}$ arylene groups, substituted and unsubstituted $C_6$-$C_{30}$ arylalkylene groups, substituted and unsubstituted $C_6$-$C_{30}$ heteroarylene groups, substituted and unsubstituted $C_6$-$C_{30}$ heteroarylalkylene groups, substituted and unsubstituted $C_6$-$C_{20}$ cycloalkylene groups, substituted and unsubstituted $C_6$-$C_{30}$ heterocycloalkylene groups, substituted and unsubstituted $C_6$-$C_{30}$ arylester groups and substituted and unsubstituted $C_6$-$C_{30}$ heteroarylester groups;

a general Formula II:

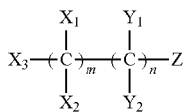

Formula II wherein m is an integer from 0 to 10,000, and n is an integer from 1 to 10,000;

wherein $X_1$, $X_2$, $X_3$, $Y_1$, and $Y_2$ are each independently selected from a group consisting of hydrogen, fluorine, substituted and unsubstituted $C_6$-$C_{30}$ aromatic groups and substituted and unsubstituted $C_5$-$C_{30}$ heteroaromatic groups having a heterogeneous atom included in an aromatic ring, and further wherein the substituted aromatic group(s) and/or substituted heteroaromatic group(s) are independently substituted with at least one substituent selected from a group consisting of $C_1$-$C_{12}$ alkyl groups, alkoxy groups, ester groups, carboxyl groups, thiol groups, and amine groups;

wherein at least one of $X_1$, $X_2$, $X_3$, $Y_1$ and $Y_2$ contains a live ion; and wherein Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$; or a general Formula III

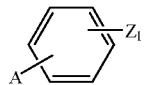

Formula III wherein A is selected from a group consisting of hydrogen, fluorine, substituted and unsubstituted $C_1$-$C_{12}$ alkyl groups, a $C_6$-$C_{30}$ aromatic group and a $C_5$-$C_{30}$ heteroaromatic group having a heterogeneous atom included in an aromatic ring, the aromatic group or heteroaromatic group containing at least one live ion, 1 is an integer from 1 to 5, and Z is selected from the group consisting of Si(OH), SiCl, Si(OEt), Si(OMe), SH, OH, NH, $SO_3H_2$, COOH, COCl, $PO_3H$, $SO_2Cl$, $OPOCl_2$ and $POCl_2$.

* * * * *